United States Patent
Yabe et al.

[11] Patent Number: 5,905,005
[45] Date of Patent: May 18, 1999

[54] X-RAY MASK AND METHOD OF FABRICATING THE SAME

[75] Inventors: Hideki Yabe; Kaeko Kitamura; Kei Sasaki, all of Hyogo, Japan

[73] Assignee: Mitsubishi Denki Kabushiki Kaisha, Tokyo, Japan

[21] Appl. No.: 08/949,339

[22] Filed: Oct. 14, 1997

[30] Foreign Application Priority Data

Mar. 24, 1997 [JP] Japan .................................. 9-070294

[51] Int. Cl.$^6$ ........................................................ G03F 9/00
[52] U.S. Cl. ................................................................ 430/5
[58] Field of Search ........................ 430/5, 322; 378/34, 378/35

[56] References Cited

U.S. PATENT DOCUMENTS

| | | | |
|---|---|---|---|
| 4,873,162 | 10/1989 | Yoshioka et al. | |
| 5,496,667 | 3/1996 | Yabe et al. | 430/5 |
| 5,541,023 | 7/1996 | Kondo et al. | 430/5 |
| 5,553,110 | 9/1996 | Sentoku et al. | 430/5 |

FOREIGN PATENT DOCUMENTS 7-135157   5/1995   Japan .

OTHER PUBLICATIONS

"Total Evaluation of W–TI Absorber for X–ray Mask" K. Marumoto et al., SPEI(The International Society for Optical Engineering), Feb. 28, 1994, vol., 2194 pp. 221–230.

"A Strategy for High Accurate X–ray Masks", K. Marumoto et al. Digest of Papers XEL 95 p. M6–2–1.

"Fabrication of X–ray Masks for Giga–Bit DRAM by Using a SIC Membrane and W–TI Absorber" K. Marumoto et al. J/Vac Sci Technol, B, vol. 14, No. 6, Nov./Dec. 1996, pp. 4359–4362.

"Stable Low–Stress Tungsten Absorber Technology for Sub–Half–Micro X–ray Lithography". R.R. Kola et al., J. Vac. Sci. Technol B9(6), Nov./Dec. 1991, pp. 3301–3305.

"Formation of Monolithic Masks for 0.25 $\mu$m X–ray lithography", G.K. Celler et al. Appln. Phys. Lett. 59(4), Dec. 9, 1991, pp. 3105–3107.

*Primary Examiner*—S. Rosasco
*Attorney, Agent, or Firm*—McDermott, Will & Emery

[57] ABSTRACT

An antireflection film formed on a membrane of an X-ray mask has an amorphous structure. A patterned X-ray absorber intercepting transmission of X-rays is formed to be in contact with the front surface of the antireflection film. Thus, an X-ray mask having excellent pattern positional accuracy and a method of fabricating the same are obtained.

12 Claims, 10 Drawing Sheets

X-RAY MASK AND METHOD OF FABRICATING THE SAME

BACKGROUND OF THE INVENTION

1. Field of the Invention

The present invention relates to an X-ray mask employed for X-ray lithography and a method of fabricating the same, and more concretely, it relates to an X-ray mask which makes it possible to reduce distortion in patterning by changing the crystal structure or stress of an etching mask or an antireflection film (etching stopper) and a method of fabricating the same.

2. Description of the Background Art

In semiconductor memory devices having relatively low degrees of integration, patterns have generally been transferred through lithography with ultraviolet rays. However, semiconductor memory devices are now implemented with higher degrees of integration, and a semiconductor memory device in the gigabit range such as a 1-gigabit DRAM (dynamic random access memory), for example, requires pattern transfer of higher resolution since patterns of wires and the like are extremely refined in accordance with device rules.

Lithography with X-rays is expected as the technique for transferring such fine patterns. According to this X-ray lithography, patterns can be transferred in higher resolution than the lithography with ultraviolet rays since X-rays serving as exposure light have shorter wavelengths ($\lambda$=5 to 20 nm in case of soft X-rays) as compared with ultraviolet rays.

A structure of an X-ray mask employed for such X-ray lithography and a method of fabricating the same are described in SPIE (The Society of Photo-Optical Instrumentation Engineers), 1994, vol. 2194, pp. 221 to 230, for example. The structure of the X-ray mask and the method of fabricating the same shown in this literature are now described as the prior art.

FIG. 8 is a sectional view schematically showing the structure of the conventional X-ray mask described in the aforementioned literature. Referring to FIG. 8, the X-ray mask has a silicon substrate 1, a membrane 2, an etching stopper serving also as an antireflection film (hereinafter simply referred to as an antireflection film) 103a, an antireflection film 103b, an X-ray absorber 104, and a support ring 5.

The membrane 2, which is a substrate transmitting X-rays, is formed on the silicon substrate 1. The antireflection films 103a and 103b are formed on the front and rear surfaces of the membrane 2 respectively. The X-ray absorber 104, consisting of a material intercepting transmission of X-rays, is formed on the antireflection film 103a in a prescribed shape. The support ring 5 is stuck to the rear surface of the silicon substrate 1 with an adhesive (not shown), and supports the silicon substrate 1.

A method of fabricating the aforementioned conventional X-ray mask is now described.

FIGS. 9 to 11 are schematic sectional views showing the method of fabricating the conventional X-ray mask in order of the steps. Referring to FIG. 9, the membrane 2 is first formed on the silicon substrate 1, and thereafter a part of the silicon substrate 1 is removed (back-etched), to expose the rear surface of the membrane 2. Thereafter the antireflection films 103a and 103b are formed on the front and rear surfaces of the membrane 2 respectively. Thereafter the support ring 5 is stuck to the silicon substrate 1.

Referring to FIG. 10, the X-ray absorber 104 is formed on the antireflection film 103a by sputtering, for example. The current mean membrane stress of the X-ray absorber 104 is measured, a temperature for zeroing the mean stress is decided, and the X-ray absorber 104 is uniformly annealed in an oven at 250° C., for example, so that its mean membrane stress is adjusted to zero. An etching mask 106 is formed on the X-ray absorber 104 by sputtering, for example. A resist material 7 is applied onto this etching mask 106, and thereafter baked at 180° C., for example.

Referring to FIG. 11, a pattern is drawn on the resist material 7 with an electron beam drawer (EB), and thereafter developed to form a resist pattern 7. The etching mask 106 is etched through the resist pattern 7. Thereafter the X-ray absorber 104 is etched through the etching mask 106. Finally, the etching mask 106 is removed, to complete the X-ray mask shown in FIG. 8.

The steps of back-etching the silicon substrate 1 and sticking the silicon substrate 1 to the support ring 5 are not necessarily performed in this order.

In relation to a semiconductor memory device in the gigabit range requiring fine working, the resist pattern 7 cannot be increased in thickness. If the resist pattern 7 is directly formed on the X-ray absorber 104 for patterning the X-ray absorber 104, the resist pattern 7 may completely disappear during this patterning. However, the etching mask 106 consists of a material having a high etching selection ratio with respect to the X-ray absorber 104, and hence serves as a mask if the resist pattern 7 disappears during patterning of the X-ray absorber 104. Thus, the etching mask 106 is useful.

X-ray lithography, which is employed for transferring fine patterns due to the short wavelengths of X-rays, is generally applied to transfer of equal-scale magnification due to the properties of the X-rays. Therefore, high pattern positional accuracy is required of the X-ray mask. If stress remains in the X-ray absorber 104, however, the pattern position thereof is moved by this stress along arrow as shown in FIG. 12 after the patterning, to disadvantageously reduce the positional accuracy.

In the conventional method of fabricating an X-ray mask, therefore, annealing is performed for zeroing the mean membrane stress of the X-ray absorber 104.

However, the etching mask 106 formed in the conventional method of fabricating an X-ray mask generally has a columnar crystal structure. Therefore, the etching mask 106 is readily patterned along grain boundaries through the resist pattern 7 serving as a mask as shown in FIGS. 13A and 13B, to result in edge roughness of the pattern. When the etching mask 106 causing such edge roughness is employed as a mask for patterning the X-ray absorber 104, the pattern is misregistered by a dimension $W_0$ in FIGS. 13A and 13B, disadvantageously leading to deterioration of the pattern accuracy.

FIG. 13B shows the X-ray mask as viewed from the direction of arrow in FIG. 13A, while omitting the resist pattern 7.

In the conventional method of fabricating an X-ray mask, no consideration is given to stress and stress irregularity of the etching mask 106 and the antireflection film 103a, although the stress of the X-ray absorber 104 is taken into account. Therefore, the positional accuracy is disadvantageously deteriorated after the patterning of the X-ray absorber 104. This problem is now described in detail with reference to the etching mask 106 having stress irregularity.

FIGS. 14 to 17 are schematic sectional views for illustrating the deterioration of the positional accuracy caused by stress irregularity of the etching mask 106 in the conventional method of fabricating an X-ray mask. Referring to FIGS. 14 to 17, the antireflection film 103b and the support ring 5 shown in FIG. 8 are omitted, for convenience of illustration.

Referring to FIG. 14, the mean membrane stress of the X-ray absorber 104 is zeroed by annealing, as hereinabove described.

Referring to FIG. 15, the etching mask 106 having stress irregularity shown in FIG. 18 is formed on the X-ray absorber 104. In this case, a prescribed point A of the X-ray absorber 104 is pulled and moved by the stress of the etching mask 106.

Referring to FIG. 16, the etching mask 106 is patterned through the resist pattern 7 serving as a mask in this state, and the X-ray absorber 104 is patterned through the patterned etching mask 106.

Referring to FIG. 17, the resist pattern 7 and the etching mask 106 are thereafter removed, whereby the point A of the X-ray absorber 104 is released from the stress of the etching mask 106 and restored to the original position. Thus, the pattern position is misregistered by the dimension $W_1$ of this restoration.

SUMMARY OF THE INVENTION

An object of the present invention is to provide an X-ray mask having excellent pattern positional accuracy and a method of fabricating the same.

The X-ray mask according to the present invention comprises a membrane, an antireflection film, and an X-ray absorber. The membrane transmits X-rays. The antireflection film is formed on the membrane, and prevents reflection of alignment light. The X-ray absorber is in contact with the surface of the antireflection film, patterned, and intercepts transmission of X-rays. The antireflection film contains an amorphous structure.

In the X-ray mask according to the present invention, the antireflection film contains an amorphous structure, whereby the X-ray absorber formed thereon to be in contact with the same is readily converted to an amorphous structure. When containing an amorphous structure, the X-ray absorber is prevented from being patterned along grain boundaries, whereby no edge roughness is caused but excellent pattern dimensional accuracy is obtained.

In the aforementioned aspect, the antireflection film is preferably entirely in an amorphous structure. Thus, the X-ray absorber is further readily converted to an amorphous structure.

In the aforementioned aspect, the X-ray absorber preferably contains an amorphous structure. Thus, the aforementioned excellent pattern dimensional accuracy is obtained.

In the aforementioned aspect, the antireflection film preferably consists of a material containing at least one component selected from a group consisting of a nitride of chromium, an oxide of chromium, an oxynitride of chromium, tin oxide, silicon carbide and silicon nitride. The antireflection film prepared from such a proper material can prevent reflection of X-rays, and serves as an etching stopper when the X-ray absorber is etched.

A method of fabricating an X-ray mask according to one aspect of the present invention comprises the following steps:

First, an X-ray absorber intercepting transmission of X-rays is formed on a membrane transmitting X-rays. A masking layer consisting of a material which is different from that of the X-ray absorber is formed on the X-ray absorber. The masking layer is patterned into a prescribed shape. Then, the X-ray absorber is patterned through the masking layer serving as a mask. The masking layer contains an amorphous structure at least at the time of patterning the X-ray absorber.

In the method of fabricating an X-ray mask according to the aspect of the present invention, the masking layer containing an amorphous structure is prevented from being patterned along grain boundaries. Thus, no edge roughness results from this patterning, whereby the X-ray absorber patterned through the masking layer serving as a mask is not deteriorated in pattern accuracy by edge roughness. Therefore, an X-ray mask having excellent pattern dimensional accuracy can be obtained.

In the aforementioned aspect, the masking layer is preferably entirely in an amorphous structure at least at the time of patterning the X-ray absorber. Thus, the masking layer is completely prevented from being patterned along grain boundaries. Thus, an X-ray mask having further excellent pattern positional accuracy can be obtained.

A method of fabricating an X-ray mask according to another aspect of the present invention comprises the following steps:

First, an antireflection film for preventing reflection of alignment light is formed on a membrane transmitting X-rays. An X-ray absorber intercepting transmission of X-rays is formed to be in contact with the surface of the antireflection film. The X-ray absorber is patterned into a prescribed shape. The antireflection film contains an amorphous structure at least at the time of forming the X-ray absorber.

In the method of fabricating an X-ray mask according to this aspect of the present invention, the antireflection film contains an amorphous structure, whereby the X-ray absorber which is formed thereon in contact with the same is readily converted to an amorphous structure. When containing an amorphous structure, the X-ray absorber is prevented from being patterned along grain boundaries, whereby no edge roughness is caused but excellent pattern dimensional accuracy is obtained.

In the aforementioned aspect, the antireflection film is preferably entirely in an amorphous structure at least at the time of forming the X-ray absorber. Thus, the X-ray absorber is further readily converted to an amorphous structure.

A method of fabricating an X-ray mask according to still another aspect of the present invention comprises the following steps:

First, an antireflection film for preventing reflection of alignment light is formed on a membrane transmitting X-rays. An X-ray absorber intercepting transmission of X-rays is formed to be in contact with the surface of the antireflection film. A masking layer consisting of a material which is different from that of the X-ray absorber is formed on the X-ray absorber. The X-ray absorber is patterned through the masking layer serving as a mask. At least either the antireflection film or the masking layer consists of a chromium nitride film which is formed by employing a chromium target and sputtering the same with sputtering gas prepared from inert gas containing nitrogen.

In the method of fabricating an X-ray mask according to this aspect of the present invention, at least either the antireflection film or the masking layer consists of a chromium nitride film which is formed by employing a chromium target and sputtering the same with sputtering gas prepared from inert gas containing nitrogen. Due to such formation of either the antireflection film or the masking layer, an antireflection film or a masking layer having low stress is obtained. Thus, the X-ray absorber can be prevented from reducing pattern positional accuracy by being pulled by the stress of the antireflection film or the masking layer.

A method of fabricating an X-ray mask according to a further aspect of the present invention comprises the following steps:

First, an antireflection film for preventing reflection of alignment light is formed on a membrane transmitting X-rays. An X-ray absorber intercepting transmission of X-rays is formed to be in contact with the surface of the antireflection film. A masking layer consisting of a material which is different from that of the X-ray absorber is formed on the X-ray absorber. The X-ray absorber is patterned through the masking layer serving as a mask. At least either the antireflection film or the masking layer consists of a chromium nitride film which is formed by employing a target containing nitrogen and chromium and sputtering the same.

In the method of fabricating an X-ray mask according to this aspect of the present invention, at least either the antireflection film or the masking layer consists of a chromium nitride film which is formed by employing a target containing nitrogen and chromium and sputtering the same. Due to such formation of either the antireflection film or the masking layer, an antireflection film or a masking layer having low stress and low stress irregularity can be obtained. Thus, the X-ray absorber can be prevented from reducing pattern positional accuracy by being pulled by the stress of the antireflection film or the masking layer.

A method of fabricating an X-ray mask according to a further aspect of the present invention comprises the following steps:

An X-ray absorber intercepting transmission of X-rays is formed on a membrane transmitting X-rays. A mask consisting of a material which is different from that of the X-ray absorber is formed on the X-ray absorber. The masking layer is patterned into a prescribed shape. The X-ray absorber is patterned through the masking layer serving as a mask. Assuming that da represents the thickness of the X-ray absorber and de represents that of the masking layer, local stress in the masking layer is not more than ±10×da/de MPa at least at the time of patterning the X-ray absorber.

In the method of fabricating an X-ray mask according to this aspect of the present invention, the local stress in the masking layer is not more than ±10×da/de MPa at least at the time of patterning the X-ray absorber, whereby the pattern of the X-ray absorber can be prevented from misregistration after the patterning. Thus, an X-ray mask having excellent pattern positional accuracy can be obtained.

A method of fabricating an X-ray mask according to a further aspect of the present invention comprises the following steps:

An antireflection film for preventing reflection of alignment light is formed on a membrane transmitting X-rays. An X-ray absorber intercepting transmission of X-rays is formed to be in contact with the surface of the antireflection film. The X-ray absorber is patterned into a prescribed shape. The X-ray absorber is patterned by etching, and a partial surface of the antireflection film is etching-removed by overetching of the X-ray absorber. Assuming that da represents the thickness of the X-ray absorber, T represents the overetching time for the X-ray absorber in this etching, and E represents the etching rate for the antireflection film in the etching, local stress in the part of the antireflection film removed by the overetching is not more than ±10×da/(E×T) MPa.

In the method of fabricating an X-ray mask according to this aspect of the present invention, the local stress in the part of the antireflection film removed by the overetching is not more than ±10×da/(E×T) MPa, whereby the pattern of the X-ray absorber can be prevented from misregistration after the patterning. Thus, an X-ray mask having excellent pattern positional accuracy can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

Embodiment 1

Figure 1:
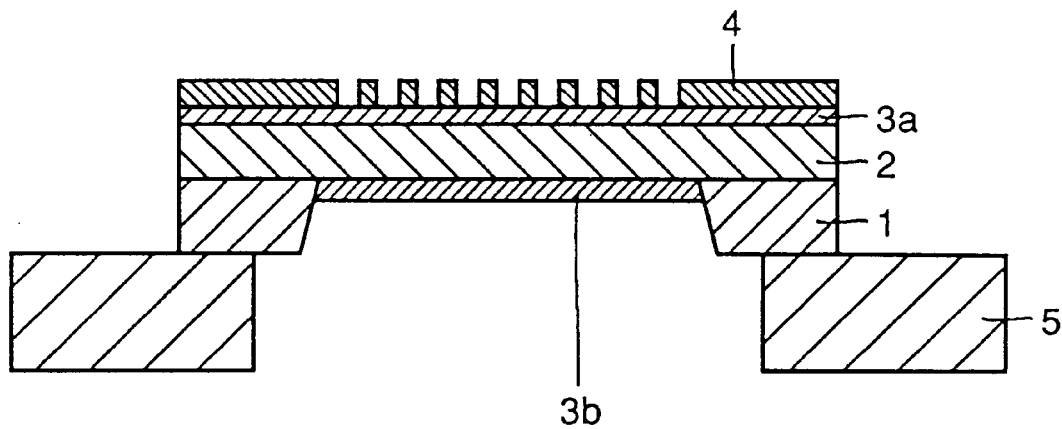
FIG. 1 is a sectional view schematically showing the structure of an X-ray mask according to an embodiment 1 of the present invention.

Referring to FIG. 1, an X-ray mask according to an embodiment 1 of the present invention has a silicon substrate 1, a membrane 2, an etching stopper serving also as an antireflection film (hereinafter simply referred to as an antireflection film) 3a, an antireflection film 3b, an X-ray absorber 4, and a support ring 5.

The membrane 2, which is a substrate transmitting X-rays, has a thickness of 1 to 2 $\mu$m, for example, consists of a light element, and is formed on the silicon substrate 1.

The antireflection film 3a is formed on the front surface of the membrane 2, and consists of indium-tin oxide, for example. The antireflection film 3b is formed on the rear surface of the membrane 2, and consists of indium-tin oxide, for example. These antireflection films 3a and 3b are adapted to prevent reflection of alignment light. The X-ray absorber 4 is formed on the antireflection film 3a in a prescribed shape, and consists of a material such as a tantalum material, for example, intercepting transmission of X-rays. The support ring 5 is stuck to the rear surface of the silicon substrate 1 with an adhesive (not shown), and supports the silicon substrate 1.

In the structure of the X-ray mask according to this embodiment, is it particularly notable that the antireflection film 3a contains an amorphous structure. The antireflection film 3a is preferably entirely in an amorphous structure. The X-ray absorber 4 preferably also contains an amorphous structure.

The antireflection film 3a is not restricted to indium-tin oxide but preferably consists of a material containing at least one component selected from a group consisting of a nitride of chromium, an oxide of chromium, an oxynitride of chromium, tin oxide, silicon carbide and silicon nitride.

The X-ray absorber 4 is not restricted to the tantalum material either, but may consist a tungsten film.

A method of fabricating the X-ray mask according to this embodiment is now described.

Figure 2:
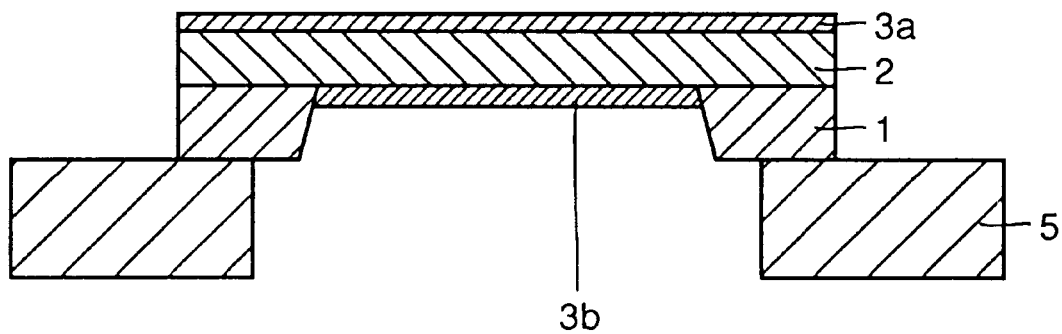
FIGS. 2 to 4 are schematic sectional views showing a method of fabricating an X-ray mask according to the embodiment 1 of the present invention in order of the steps.

Referring to FIG. 2, the membrane 2 of 1 to 2 μm in thickness consisting of a light element is formed on the silicon substrate 1. A part of the silicon substrate 1 is back-etched, to expose the rear surface of the membrane 2. The antireflection films 3a and 3b are formed on the front and rear surfaces of the membrane 2 respectively. In particular, the antireflection film 3a is formed to contain an amorphous structure. Thereafter the silicon substrate 1 is stuck to the support ring 5 with an adhesive (not shown).

Figure 3:
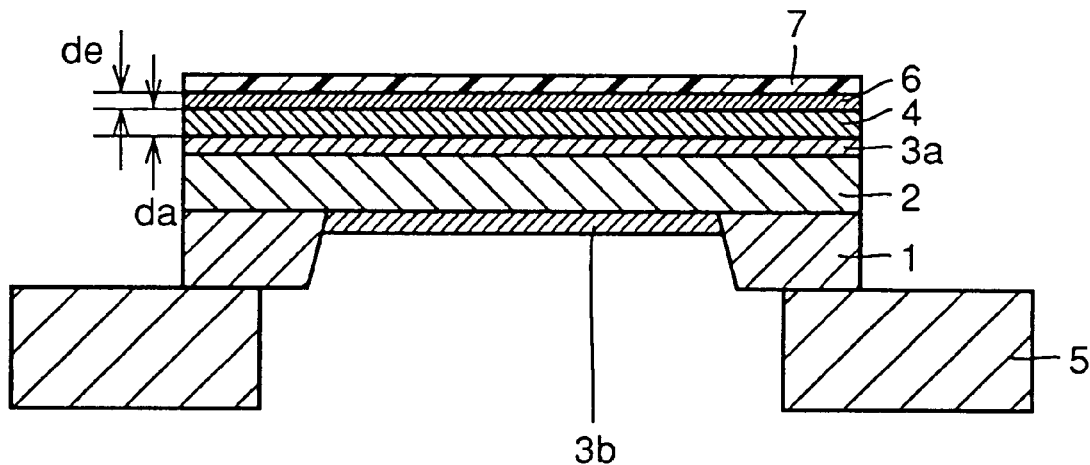

Referring to FIG. 3, the X-ray absorber 4 of a tantalum material, for example, is formed on the antireflection film 3a by sputtering, for example. If the antireflection film 3a contains an amorphous structure, the X-ray absorber 4 is readily converted to an amorphous structure. The current mean membrane stress of the X-ray absorber 4 is measured, a temperature for zeroing the mean stress is decided, and the X-ray absorber 4 is uniformly annealed in an oven at 250° C., for example, so that the mean membrane stress of the X-ray absorber 4 is adjusted to zero.

Then, an etching mask 6 consisting of tungsten is formed by sputtering, for example, to contain an amorphous structure. The etching mask 6 is sputtered with sputtering gas prepared by adding 7% of N (nitrogen) to Ar (argon), at an output of 650 W under a pressure of 9 mTorr.

Thereafter a resist material 7 is applied onto the etching mask 6, and baked at 180° C., for example.

Figure 4:
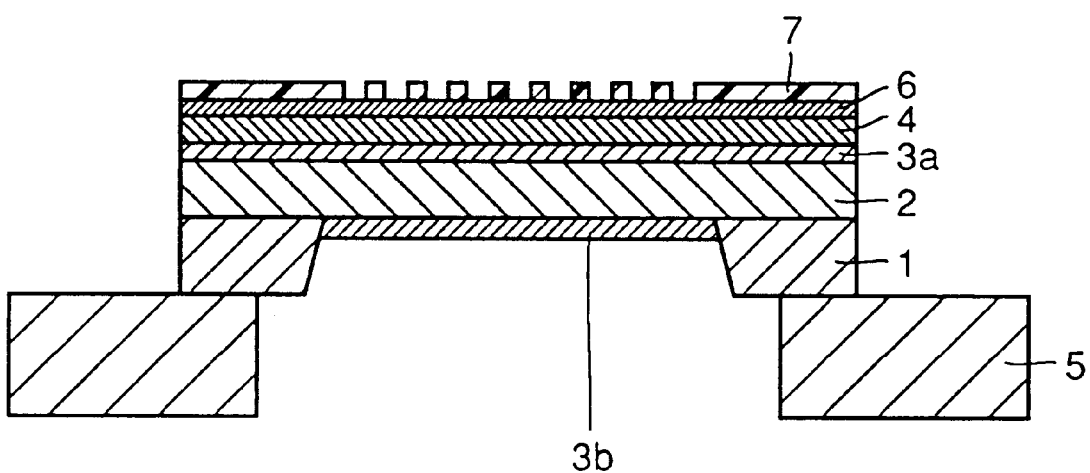

Referring to FIG. 4, a pattern is drawn on the resist material 7 with an electron beam drawer (EB), and thereafter developed to form a resist pattern 7. The etching mask 6 is etched through this resist pattern 7. The etching mask 6 has an amorphous structure at least in this etching. Thereafter the X-ray absorber 4 is etched through the patterned etching mask 6, and patterned. The X-ray absorber 4 preferably contains an amorphous structure in this patterning. Finally, the etching mask 6 is removed, to complete the X-ray mask.

The steps of back-etching the silicon substrate 1 and sticking the silicon substrate 1 to the support ring 5 are not necessarily performed in this order.

Figure 13A:
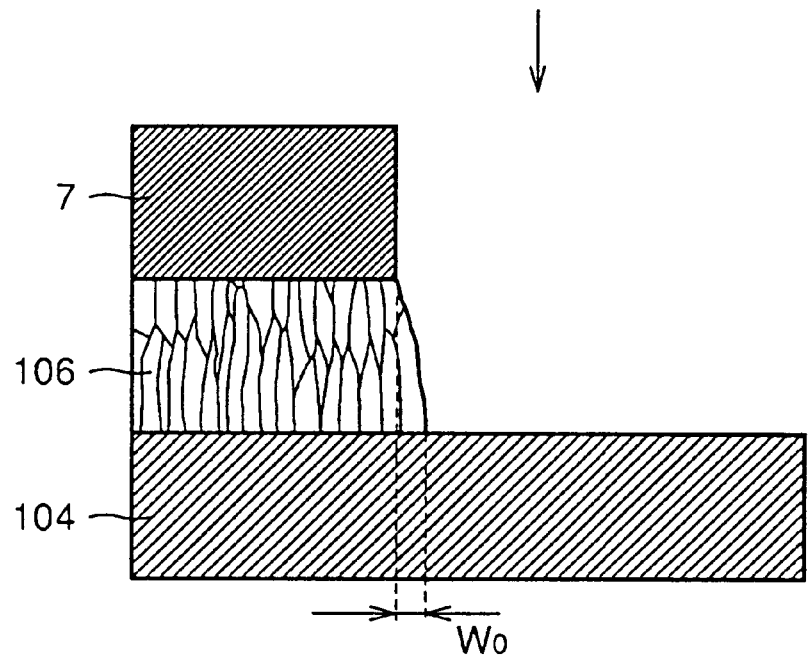
FIGS. 13A and 13B are schematic sectional views showing an etching mask having a columnar crystal structure which is patterned along grain boundaries.
Figure 13B:
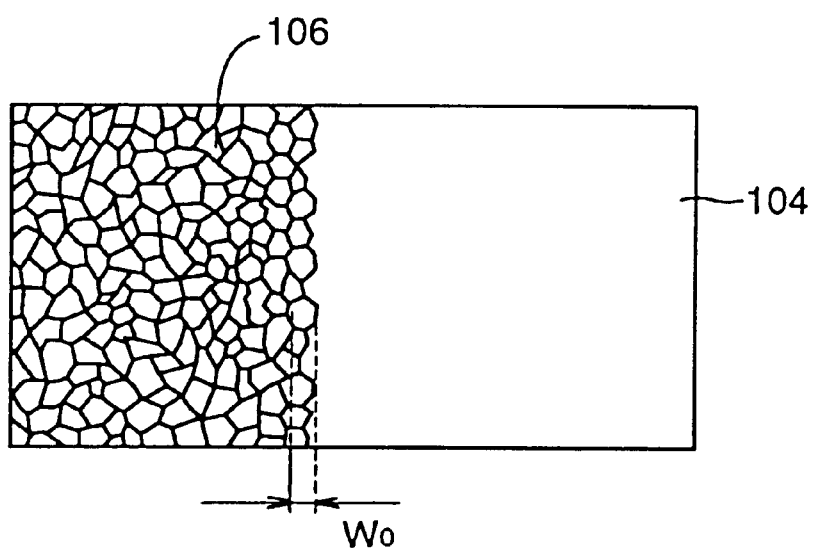
Figure 14:
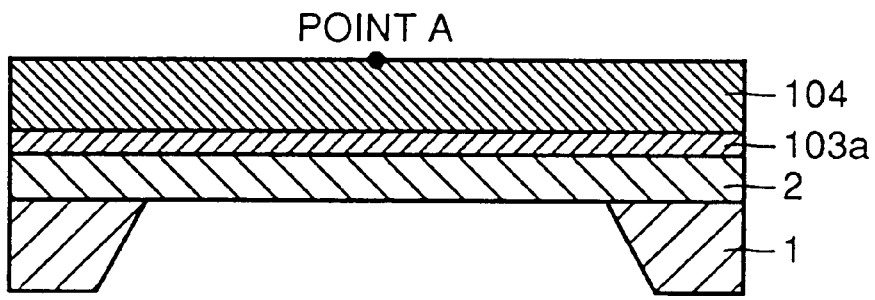
FIGS. 14 to 17 are step diagrams for illustrating misregistration of a pattern of an X-ray absorber caused by stress irregularity of an etching mask.

According to this embodiment, the etching mask 6 contains an amorphous structure at the time of patterning of etching mask 6, as shown in FIG. 4. Therefore, the etching mask 6 is not patterned along grain boundaries thereof, dissimilarly to the etching mask 106 illustrated in FIGS. 13A and 13B. Thus, no edge roughness results in the etching mask 6 from the patterning. Thus, the pattern accuracy of the X-ray absorber 4 is not deteriorated by such edge roughness, and an X-ray mask having excellent dimensional accuracy can be obtained.

When the antireflection film 3a contains an amorphous structure, the X-ray absorber 4 formed on the antireflection film 3a is readily converted to an amorphous structure. While the X-ray absorber 4 has a columnar crystal structure in general, the X-ray absorber 4 is not patterned along grain boundaries similarly to the above when converted to an amorphous structure, whereby the pattern dimensional accuracy is improved.

While both of the antireflection film 3a and the etching mask 6 contain amorphous structures in the method according to this embodiment, either the antireflection film 3a or the etching mask 6 may have an amorphous structure.

Embodiment 2

The inventors have discovered that stress in the antireflection film 3a and the etching mask 6 shown in FIG. 3 can be reduced by forming these films under prescribed conditions. The contents and the results of this experiment are now described.

As a comparative sample, a chromium film was formed on a silicon wafer of 3 inches by employing a chromium and sputtering the same through a magnetron sputtering apparatus under conditions of an Ar flow rate of 80 cm³/min., a direct current of 500 W, and a sputtering gas pressure of 15 mTorr.

As an inventive sample, a chromium nitride film was formed on a silicon wafer of 3 inches by employing a chromium target and sputtering the same through a magnetron sputtering apparatus under conditions of an Ar flow rate of 80 cm³/min., an $N_2$ flow rate of 6 cm³/min., a direct current of 100 W, and a sputtering gas pressure of 17 mTorr.

Figure 5:
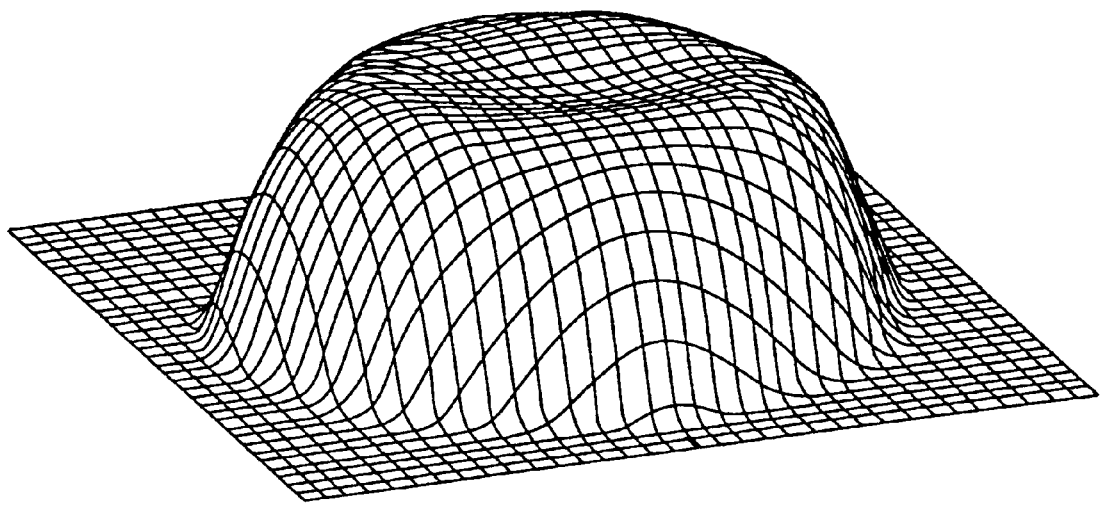
FIG. 5 illustrates the stress distribution of a conventional chromium film formed with sputtering gas containing no nitrogen.
Figure 6:
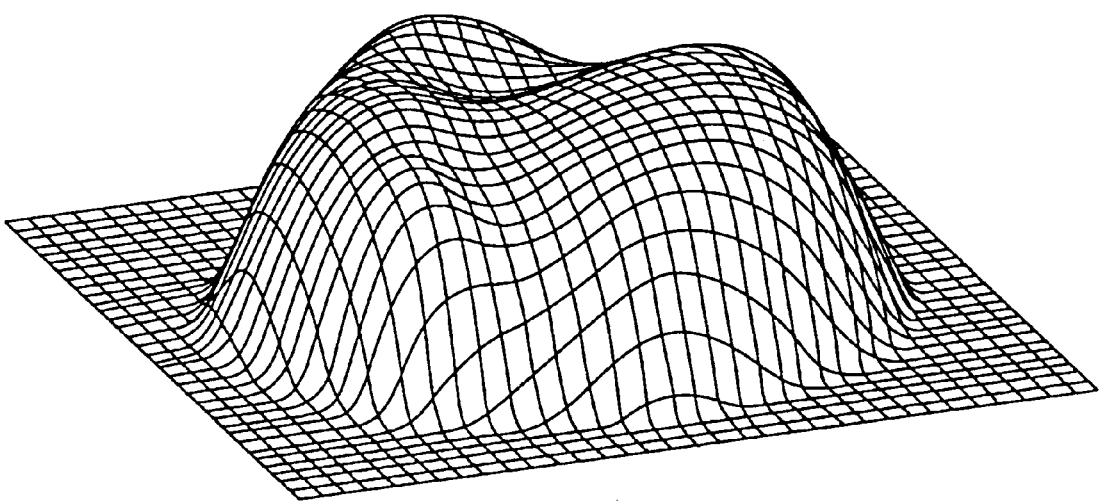
FIG. 6 illustrates the stress distribution of a chromium nitride film formed with sputtering gas containing nitrogen.

The chromium film of the comparative sample and the chromium nitride film of the inventive sample were annealed at 180° C., and thereafter stress distributions of these films were measured in areas of ø50 mm. FIGS. 5 and 6 show the results of the comparative and inventive samples respectively.

Referring to FIG. 5, the chromium film of the comparative sample exhibited mean stress of 1338 MPa, maximum stress of 1380 MPa and minimum stress of 1170 MPa in 25 mm□.

Referring to FIG. 6, on the other hand, the chromium nitride film of the inventive sample exhibited mean stress of 92.7 MPa, maximum stress of 105.2 MPa and minimum stress of 68.2 MPa in 25 mm□.

From these results, it has clearly been understood that the chromium nitride film of the inventive sample formed with addition of nitrogen to the sputtering gas exhibited lower stress and smaller stress irregularity than the chromium film of the comparative sample.

Accordingly, at least either the antireflection film 3a shown in FIG. 2 or the etching mask 6 shown in FIG. 3 is formed by employing a chromium target and sputtering the same with sputtering gas prepared from inert gas such as Ar, for example, containing nitrogen in a method of fabricating an X-ray mask according to an embodiment 2 of the present invention.

The aforementioned chromium nitride film is preferably formed under sputtering conditions of inert gas containing at least 5% of nitrogen with a sputtering gas pressure of at least 10 mTorr.

The remaining steps of this method are similar to those of the embodiment 1, and hence redundant description is omitted.

At least either the antireflection film 3a or the etching mask 6 is formed in the aforementioned manner, whereby at least either the antireflection film 3a or the etching mask 6 consists of a chromium nitride film according to this embodiment.

The remaining structure is also similar to that of the embodiment 1, and hence redundant description is omitted.

According to this embodiment, the antireflection film 3a and the etching mask 6 have low stress, and hence the same may not be brought into amorphous structures in particular. However, it is more preferable that the antireflection film 3a and the etching mask 6 have low stress and contain amorphous structures.

While a chromium target is sputtered with sputtering gas prepared from inert gas containing nitrogen according to this embodiment, a chromium nitride film formed by employing a target containing nitrogen and chromium and sputtering the same also has low stress, similarly to the above.

Figure 15:
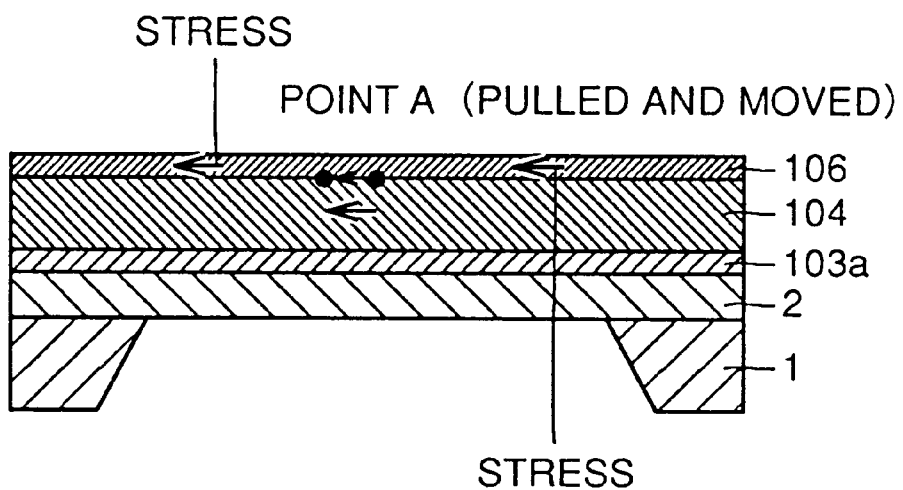
Figure 16:
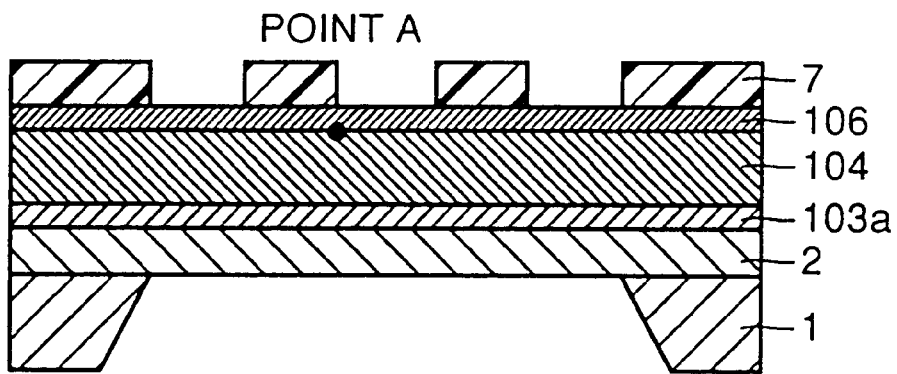
Figure 17:
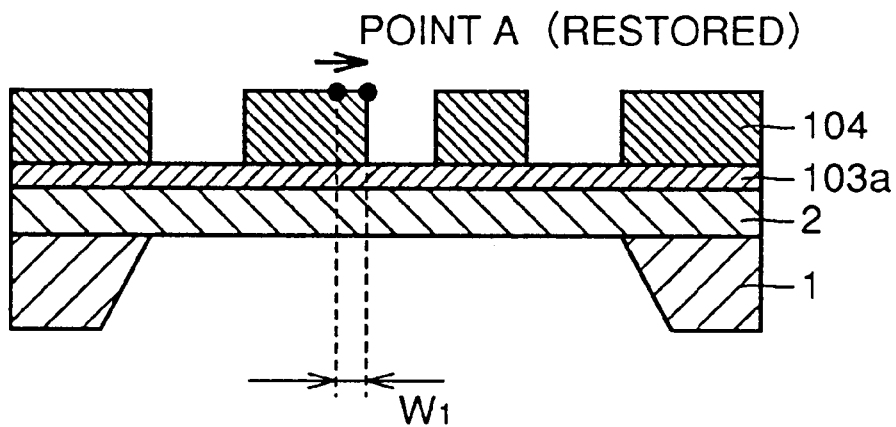
Figure 18:
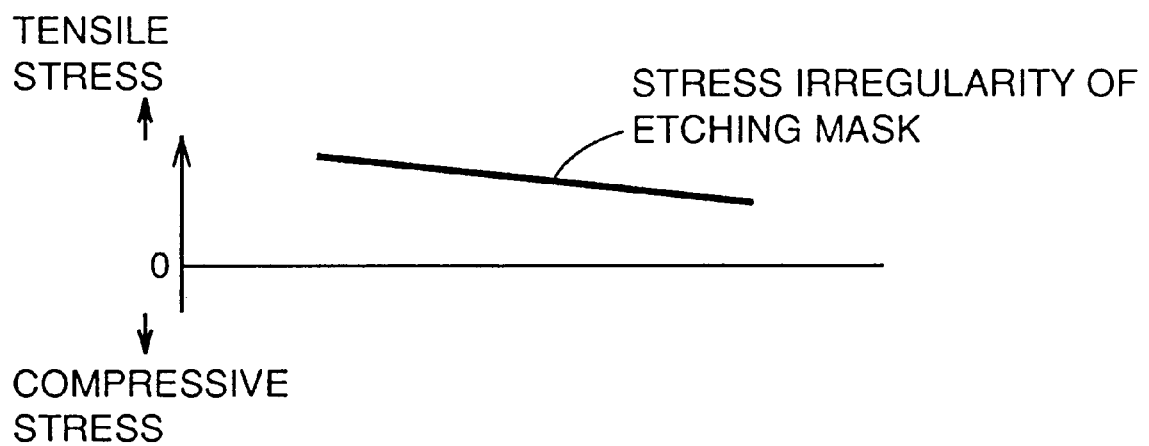
FIG. 18 illustrates the stress distribution of the etching mask in the state shown in FIG. 15.

According to this embodiment, the antireflection film 3a or the etching mask 6 having low stress and low stress irregularity is obtained by sputtering with sputtering gas prepared from inert gas containing nitrogen or employing a target containing nitrogen. Therefore, the point A shown in FIG. 15 is inhibited from pulling by stress of the etching mask 6. Therefore, no pattern misregistration of the X-ray absorber 4 results from restoration of the point A to the original position after patterning, dissimilarly to the example shown in FIG. 17. Thus, reduction of pattern positional accuracy can be prevented.

Embodiment 3

Referring to FIG. 3, the inventors have discovered that the X-ray absorber 4 is not misregistered after patterning of the X-ray absorber 4 if local stress in the etching mask 6 is not more than ±10×da/de MPa, where da and de represent the thicknesses of the X-ray absorber 4 and the etching mask 6 respectively as shown in FIG. 3. In a method of fabricating an X-ray mask according to an embodiment 3 of the present invention, the etching mask 6 is so formed or treated (e.g., heat-treated by annealing) after formation that its local stress is not more than ±10×da/de MPa in the step shown in FIG. 3.

Referring to FIG. 4, the etching mask 6 is patterned through the resist pattern 7 serving as a mask, and the X-ray absorber 4 is patterned by etching through the patterned etching mask 6. In the etching for patterning the X-ray absorber 4, the antireflection film 3a located under the X-ray absorber 4 is also etched to some extent by overetching of the X-ray absorber 4. When the antireflection film 3a is removed by such overetching, the pattern position of the X-ray absorber 4 may be misregistered for relaxation of stress in the removed part.

The inventors have found that the pattern position of the X-ray absorber 4 is not misregistered after the patterning if local stress in the part of the antireflection film 3a removed by the overetching is not more than ±10×da/(E×T) MPa, assuming that T represents the overetching time in the etching of the X-ray absorber 4 and E represents the etching rate for the antireflection film 3a in the etching conditions for the X-ray absorber 4.

Figure 7:
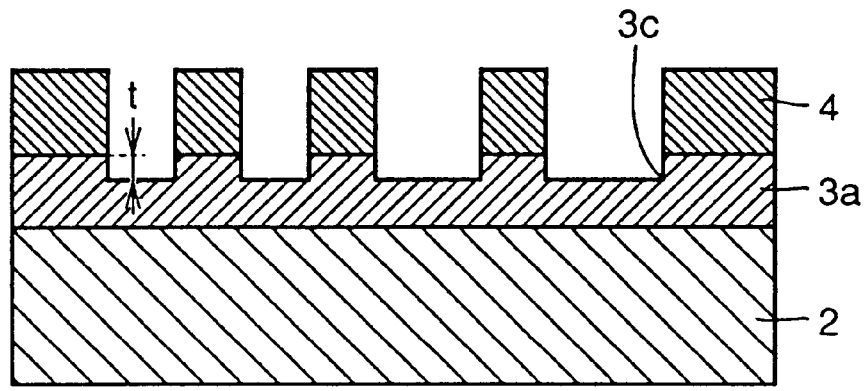
FIG. 7 is a schematic sectional view showing an antireflection film 3a overetched in etching of an X-ray absorber 4.
Figure 8:
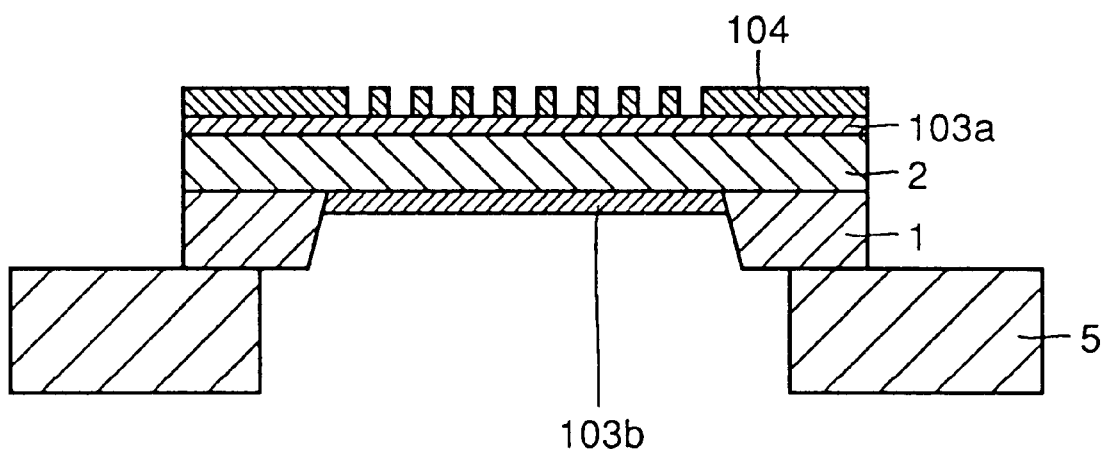
FIG. 8 is a sectional view schematically showing the structure of a conventional X-ray mask.
Figure 9:
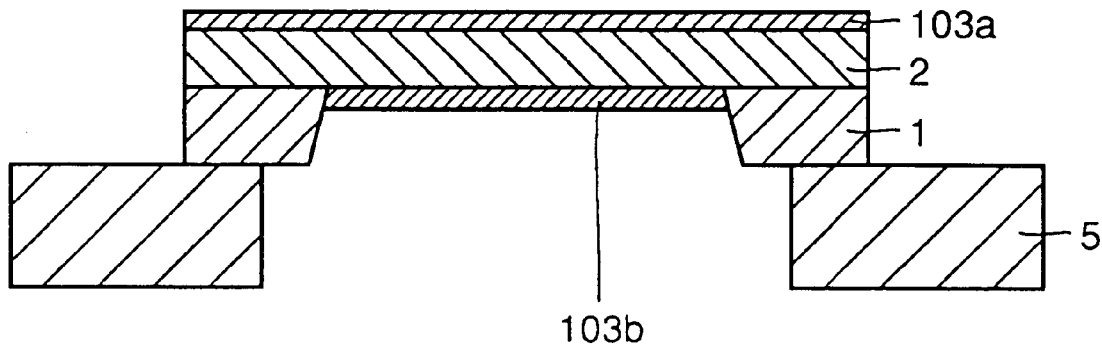
FIGS. 9 to 11 are schematic sectional views showing a conventional method of fabricating an X-ray mask in order of the steps.
Figure 10:
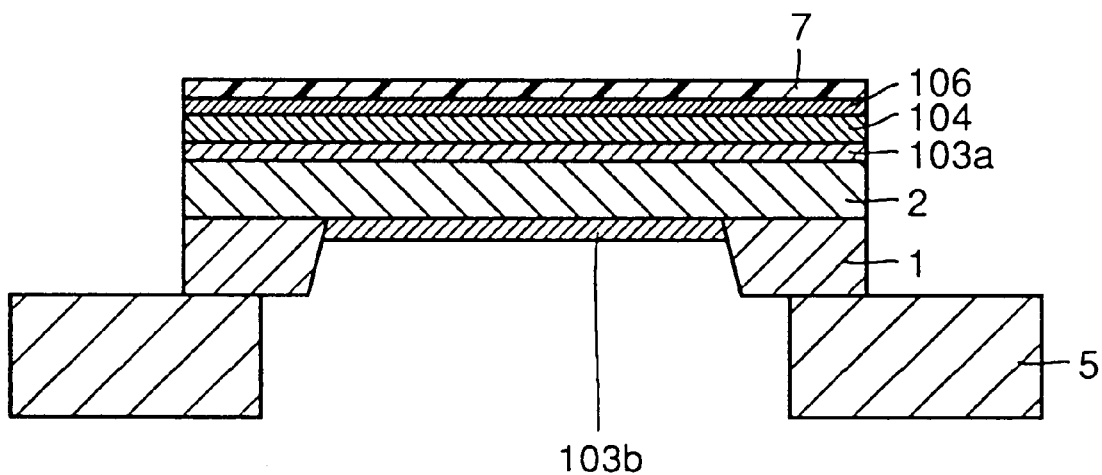
Figure 11:
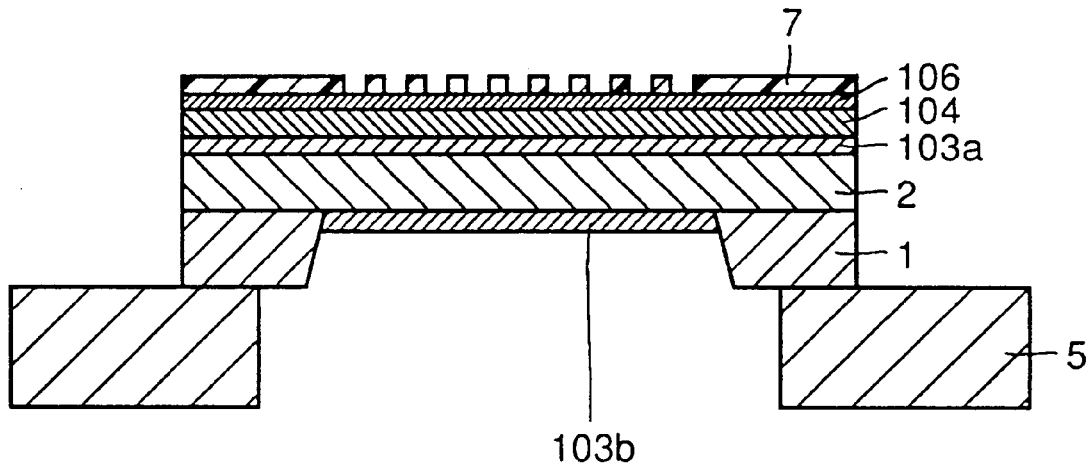
Figure 12:
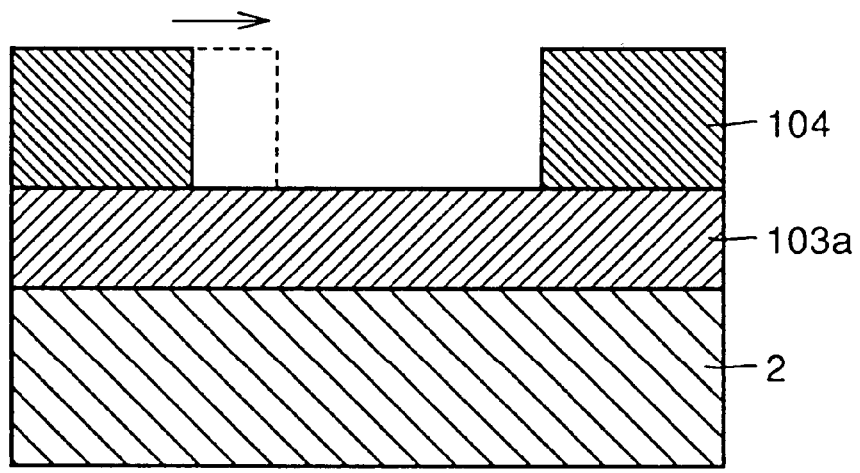
FIG. 12 is a schematic sectional view showing a pattern position of an X-ray absorber misregistered by stress remaining in the X-ray absorber.

The value E×T is substantially identical to the thickness t of the part of the antireflection film 3a removed by the overetching in the etching of the X-ray absorber 4, as shown in FIG. 7.

Accordingly, the antireflection film 3a is so formed or treated (e.g., heat-treated by annealing) after formation that local stress in the part removed during the etching of the X-ray absorber 4 is not more than ±10×da/(E×T) MPa in the method according to this embodiment.

According to this embodiment, the stress of the etching mask 6 or the antireflection film 3a is controlled below a prescribed value as hereinabove described, whereby the pattern of the X-ray absorber 4 is prevented from misregistration after the patterning. Thus, an X-ray mask having excellent pattern positional accuracy can be obtained.

In the X-ray mask according to the present invention, the antireflection film contains an amorphous structure, whereby the X-ray absorber formed thereon to be in contact with the same is readily converted to an amorphous structure. When containing an amorphous structure, the X-ray absorber is prevented from being patterned along grain boundaries, whereby no edge roughness is caused but excellent pattern dimensional accuracy is obtained.

In the aforementioned aspect, the antireflection film is preferably entirely in an amorphous structure. Thus, the X-ray absorber is further readily converted to an amorphous structure.

In the aforementioned aspect, the X-ray absorber preferably contains an amorphous structure. Thus, the aforementioned excellent pattern dimensional accuracy is obtained.

In the aforementioned aspect, the antireflection film preferably consists of a material containing at least one component selected from a group consisting of a nitride of chromium, an oxide of chromium, an oxynitride of chromium, tin oxide, silicon carbide and silicon nitride. The antireflection film prepared from such a proper material can prevent reflection of X-rays, and serves as an etching stopper when the X-ray absorber is etched.

In the method of fabricating an X-ray mask according to one aspect of the present invention, the masking layer containing an amorphous structure is prevented from being patterned along grain boundaries. Thus, no edge roughness results from this patterning, whereby the X-ray absorber patterned through the masking layer serving as a mask is not deteriorated in pattern accuracy by edge roughness. Therefore, an X-ray mask having excellent pattern dimensional accuracy can be obtained.

In the aforementioned aspect, the masking layer is preferably entirely in an amorphous structure at least at the time of patterning the X-ray absorber. Thus, the masking layer is completely prevented from being patterned along grain boundaries. Thus, an X-ray mask having further excellent pattern positional accuracy can be obtained.

In the method of fabricating an X-ray mask according to another aspect of the present invention, the antireflection film contains an amorphous structure, whereby the X-ray absorber which is formed thereon in contact with the same is readily converted to an amorphous structure. When containing an amorphous structure, the X-ray absorber is prevented from being patterned along grain boundaries, whereby no edge roughness is caused but excellent pattern dimensional accuracy is obtained.

In the aforementioned aspect, the antireflection film is preferably entirely in an amorphous structure at least at the time of forming the X-ray absorber. Thus, the X-ray absorber is further readily converted to an amorphous structure.

In the method of fabricating an X-ray mask according to still another aspect of the present invention, at least either the antireflection film or the masking layer consists of a chromium nitride film which is formed by employing a chromium target and sputtering the same with sputtering gas prepared from inert gas containing nitrogen. Due to such formation of either the antireflection film or the masking layer, an antireflection film or a masking layer having low stress is obtained. Thus, the X-ray absorber can be prevented from reducing pattern positional accuracy by being pulled by the stress of the antireflection film or the masking layer.

In the method of fabricating an X-ray mask according to the further aspect of the present invention, at least either the antireflection film or the masking layer consists of a chromium nitride film which is formed by employing a target containing nitrogen and chromium and sputtering the same. Due to such formation of either the antireflection film or the masking layer, an antireflection film or a masking layer having low stress and low stress irregularity can be obtained. Thus, the X-ray absorber can be prevented from reducing pattern positional accuracy by being pulled by the stress of the antireflection film or the masking layer.

In the method of fabricating an X-ray mask according to the further aspect of the present invention, the local stress in the masking layer is not more than ±10×da/de MPa at least at the time of forming the X-ray absorber, whereby the pattern of the X-ray absorber can be prevented from misregistration after the patterning. Thus, an X-ray mask having excellent pattern positional accuracy can be obtained.

In the method of fabricating an X-ray mask according to this aspect of the present invention, the local stress in the part of the antireflection film removed by the overetching is not more than ±10×da/(E×T) MPa, whereby the pattern of the X-ray absorber can be prevented from misregistration after the patterning. Thus, an X-ray mask having excellent pattern positional accuracy can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An X-ray mask comprising:
    a membrane transmitting X-rays;
    an antireflection film being formed on said membrane for preventing reflection of alignment light; and
    an X-ray absorber, being in contact with the surface of said antireflection film and patterned, for intercepting transmission of X-rays,
    said antireflection film containing an amorphous structure.

2. The X-ray mask in accordance with claim 1, wherein said antireflection film is entirely in an amorphous structure.

3. The X-ray mask in accordance with claim 1, wherein said X-ray absorber contains an amorphous structure.

4. The X-ray mask in accordance with claim 1, wherein said antireflection film consists of a material containing at least one component being selected from a group consisting of a nitride of chromium, an oxide of chromium, an oxynitride of chromium, tin oxide and silicon carbide.

5. A method of fabricating an X-ray mask, comprising the steps of:
    forming an X-ray absorber intercepting transmission of X-rays on a membrane transmitting X-rays;
    forming a masking layer consisting of a material being different from that of said X-ray absorber on said X-ray absorber;
    patterning said masking layer into a prescribed shape; and
    patterning said X-ray absorber through said masking layer serving as a mask,
    said masking layer containing an amorphous structure at least at the time of patterning said X-ray absorber.

6. The method of fabricating an X-ray mask in accordance with claim 5, wherein said masking layer is entirely in an amorphous structure at least at the time of patterning said X-ray absorber.

7. A method of fabricating an X-ray mask, comprising the steps of:
    forming an antireflection film for preventing reflection of alignment light on a membrane transmitting X-rays;
    forming an X-ray absorber intercepting transmission of X-rays to be in contact with the surface of said antireflection film; and
    patterning said X-ray absorber into a prescribed shape,
    said antireflection film containing an amorphous structure at least at the time of forming said X-ray absorber.

8. The method of fabricating an X-ray mask in accordance with claim 7, wherein said antireflection film is entirely in an amorphous structure at least at the time of forming said X-ray absorber.

9. A method of fabricating an X-ray mask, comprising the steps of:
    forming an antireflection film for preventing reflection of alignment light on a membrane transmitting X-rays;
    forming an X-ray absorber intercepting transmission of X-rays to be in contact with the surface of said antireflection film;
    forming a masking layer consisting of a material being different from that of said X-ray absorber on said X-ray absorber; and
    patterning said X-ray absorber through said masking layer serving as a mask,
    at least either said antireflection film or said masking layer consisting of a chromium nitride film being formed by employing a chromium target and sputtering the same with sputtering gas prepared from inert gas containing nitrogen.

10. A method of fabricating an X-ray mask, comprising the steps of:
    forming an antireflection film for preventing reflection of alignment light on a membrane transmitting X-rays;
    forming an X-ray absorber intercepting transmission of X-rays to be in contact with the surface of said antireflection film;
    forming a masking layer consisting of a material being different from that of said X-ray absorber on said X-ray absorber; and
    patterning said X-ray absorber through said masking layer serving as a mask,
    at least either said antireflection film or said masking layer consisting of a chromium nitride film being formed by employing a target containing nitrogen and chromium and sputtering the same.

11. A method of fabricating an X-ray mask, comprising the steps of:
    forming an X-ray absorber intercepting transmission of X-rays on a membrane transmitting X-rays;

forming a masking layer consisting of a material being different from that of said X-ray absorber on said X-ray absorber;

patterning said making layer into a prescribed shape; and patterning said X-ray absorber through said masking layer serving as a mask, local stress in said masking layer being not more than ±10×da/de MPa at least at the time of patterning said X-ray absorber, assuming that da represents the thickness of said X-ray absorber and de represents thickness of said masking layer.

12. A method of fabricating an X-ray mask, comprising the steps of:

forming an antireflection film for preventing reflection of alignment light on a membrane transmitting X-rays;

forming an X-ray absorber intercepting transmission of X-rays to be in contact with the surface of said antireflection film; and patterning said X-ray absorber into a prescribed shape, said X-ray absorber being patterned by etching, a partial surface of said antireflection film being etching-removed by overetching of said X-ray absorber, local stress of said part of said antireflection film being removed by said overetching is not more than ±10×da/(E×T) MPa assuming that da represents the thickness of said X-ray absorber, T represents an overetching time for said X-ray absorber in said etching, and E represents the etching rate for said antireflection film in said etching.

* * * * *